(12) United States Patent
Tsai et al.

(10) Patent No.: US 10,541,213 B2
(45) Date of Patent: Jan. 21, 2020

(54) BACKSIDE REDISTRIBUTION LAYER (RDL) STRUCTURE

(71) Applicant: Taiwan Semiconductor Manufacturing Company, Ltd., Hsinchu (TW)

(72) Inventors: Po-Hao Tsai, Zhongli (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/935,426

(22) Filed: Mar. 26, 2018

(65) Prior Publication Data

US 2018/0218985 A1    Aug. 2, 2018

Related U.S. Application Data

(60) Continuation of application No. 15/370,905, filed on Dec. 6, 2016, now Pat. No. 9,929,108, which is a
(Continued)

(51) Int. Cl.
*H01L 25/10* (2006.01)
*H01L 23/31* (2006.01)
(Continued)

(52) U.S. Cl.
CPC .......... *H01L 23/562* (2013.01); *H01L 21/486* (2013.01); *H01L 21/4853* (2013.01); *H01L 21/565* (2013.01); *H01L 23/3114* (2013.01); *H01L 23/5384* (2013.01); *H01L 23/5386* (2013.01); *H01L 23/5389* (2013.01); *H01L 24/05* (2013.01); *H01L 24/19* (2013.01); *H01L 24/20* (2013.01); *H01L 24/97* (2013.01); *H01L 25/105* (2013.01); *H01L 25/50* (2013.01); *H01L 21/568* (2013.01); *H01L 23/49827* (2013.01);
(Continued)

(58) Field of Classification Search
CPC ........... H01L 23/49827; H01L 23/5384; H01L 2224/73204; H01L 2224/11912; H01L 2224/12105; H01L 2224/13006
See application file for complete search history.

(56) References Cited

U.S. PATENT DOCUMENTS 9,553,059 B2    1/2017  Tsai et al.
2006/0258138 A1*  11/2006  Hu ...................... B41J 2/14137
                                                                438/612
(Continued)

OTHER PUBLICATIONS

Solberg, V.,"μPILRtm Package-on-Package Technology: Development and Reliability Testing," 9th Electronics Packaging Technology Conference (EPTC), Dec. 10-12, 2007, pp. 55-60.

*Primary Examiner* — Seahvosh Nikmanesh
*Assistant Examiner* — Xiaoming Liu
(74) *Attorney, Agent, or Firm* — Slater Matsil, LLP

(57) ABSTRACT

An embodiment package on package (PoP) device includes a molding compound having a metal via embedded therein, a passivation layer disposed over the molding compound, the passivation layer including a passivation layer recess vertically aligned with the metal via, and a redistribution layer bond pad capping the metal via, a portion of the redistribution layer bond pad within the passivation layer recess projecting above a top surface of the molding compound.

20 Claims, 15 Drawing Sheets

Related U.S. Application Data division of application No. 14/137,231, filed on Dec. 20, 2013, now Pat. No. 9,553,059.

(51) Int. Cl.
*H01L 23/00* (2006.01)
*H01L 25/00* (2006.01)
*H01L 23/538* (2006.01)
*H01L 21/48* (2006.01)
*H01L 21/56* (2006.01)
*H01L 23/498* (2006.01)

(52) U.S. Cl.
CPC ........ *H01L 24/73* (2013.01); *H01L 2224/024* (2013.01); *H01L 2224/0231* (2013.01); *H01L 2224/02331* (2013.01); *H01L 2224/02372* (2013.01); *H01L 2224/04042* (2013.01); *H01L 2224/04105* (2013.01); *H01L 2224/06181* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/12042* (2013.01); *H01L 2924/1431* (2013.01); *H01L 2924/1434* (2013.01); *H01L 2924/1436* (2013.01); *H01L 2924/15311* (2013.01); *H01L 2924/181* (2013.01); *H01L 2924/3512* (2013.01)

(56) References Cited

U.S. PATENT DOCUMENTS

| | | |
|---|---|---|
| 2008/0030968 A1 | 2/2008 | Mashino |
| 2009/0045512 A1 | 2/2009 | Hedler et al. |
| 2009/0224391 A1* | 9/2009 | Lin ............... H01L 21/6835 257/690 |
| 2010/0038789 A1 | 2/2010 | Cheng et al. |
| 2010/0308443 A1 | 12/2010 | Suthiwongsunthorn et al. |
| 2011/0048773 A1* | 3/2011 | Kaneko ........... H01L 21/6835 174/257 |
| 2011/0155433 A1 | 6/2011 | Funaya et al. |
| 2013/0062761 A1 | 3/2013 | Lin et al. |
| 2013/0214423 A1 | 8/2013 | Sadaka |

* cited by examiner

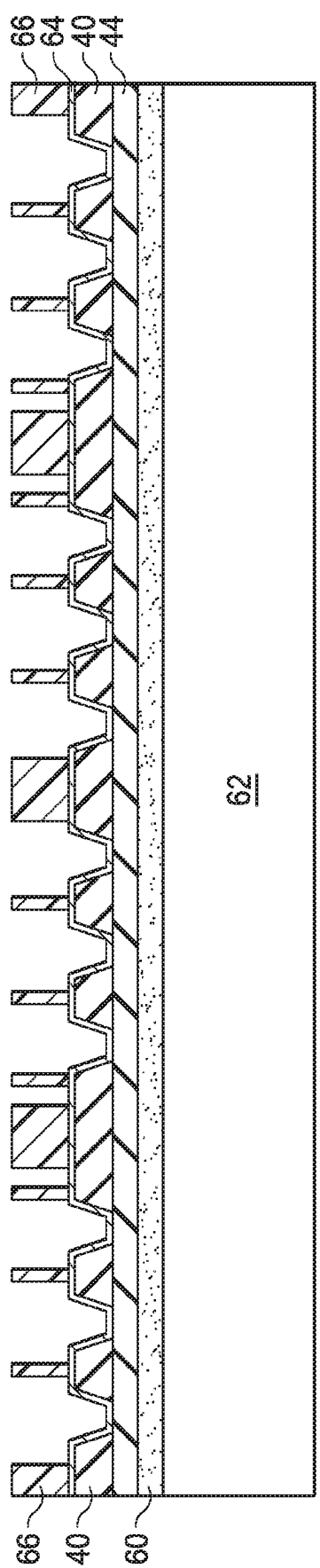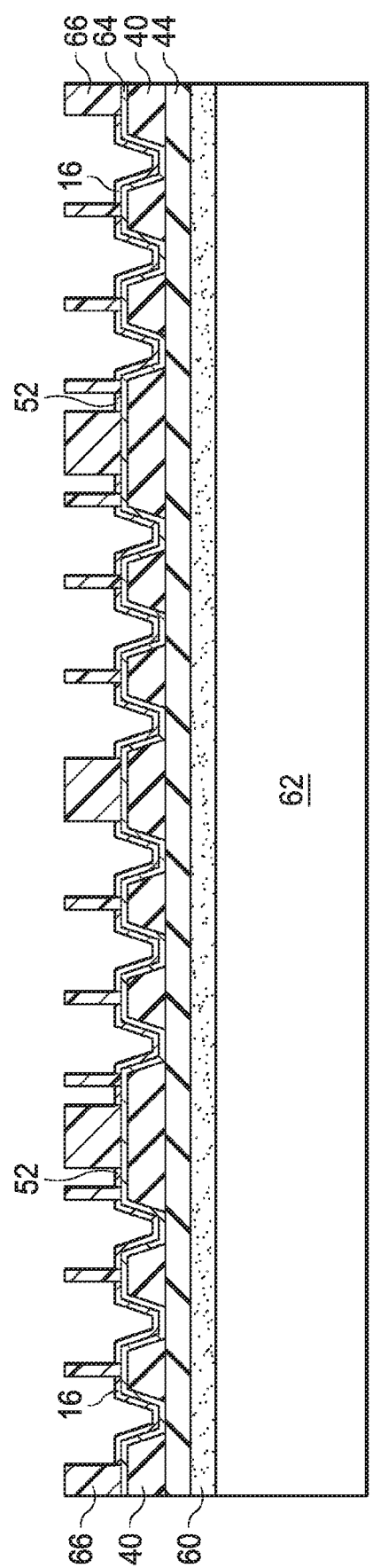

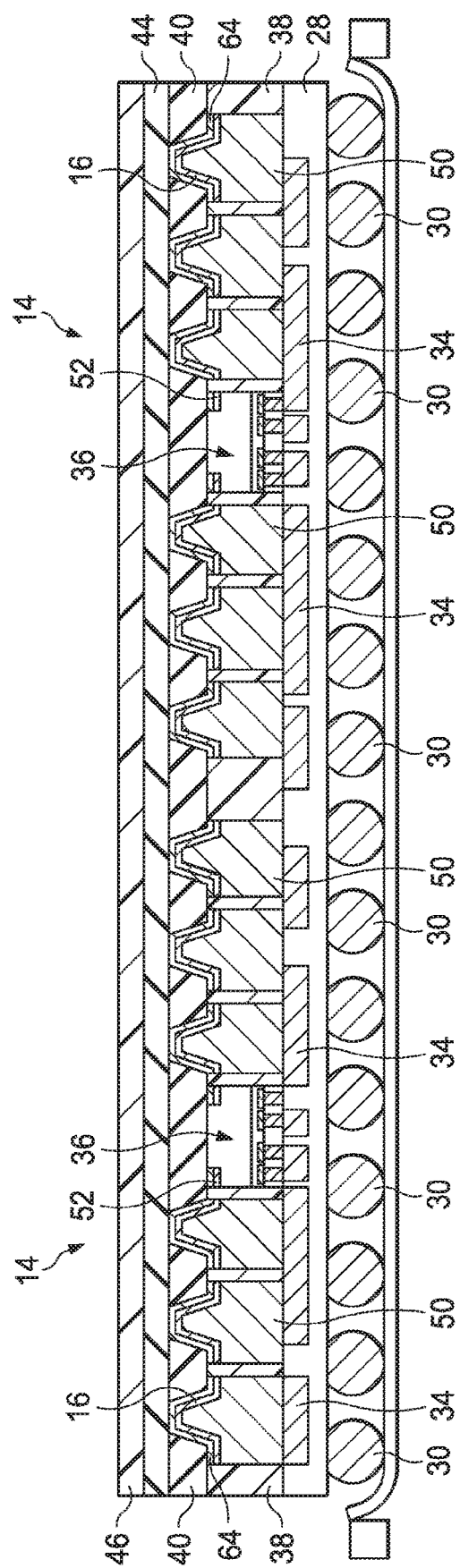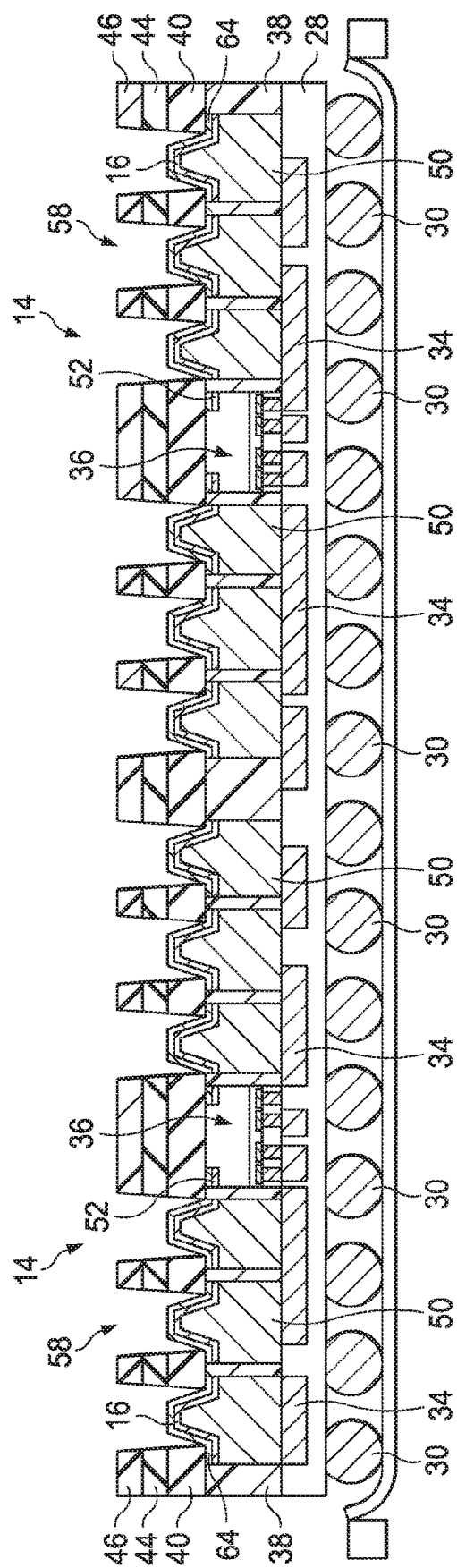

BACKSIDE REDISTRIBUTION LAYER (RDL) STRUCTURE

PRIORITY CLAIM AND CROSS-REFERENCE

This application is a continuation of U.S. patent application Ser. No. 15/370,905, filed on Dec. 6, 2016, entitled "Backside Redistribution Layer (RDL) Structure," which is a divisional of U.S. patent application Ser. No. 14/137,231, now U.S. Pat. No. 9,553,059 filed on Dec. 20, 2013, entitled "Backside Redistribution Layer (RDL) Structure," which applications are hereby incorporated herein by reference in their entireties.

BACKGROUND

As the demand for smaller electronic products grows, manufacturers and others in the electronics industry continually seek ways to reduce the size of integrated circuits used in the electronic products. In that regard, three-dimensional (3D) type integrated circuit (IC) packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic packages. In some cases, the PoP device is referred to an integrated fan-out (InFO) PoP device because the contact positions of the original die are "fanned out" to a larger foot print.

If not appropriately or suitably formed, the InFO PoP devices may be subject to electrical failures or have poor reliability. For example, the InFO PoP devices may experience crack propagation or suffer ball fatigue.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a three dimensional (3D) integrated fan-out (InFO) package-on-package (PoP) device. The concepts in the disclosure may also apply, however, to other semiconductor structures or circuits.

Figure 1:
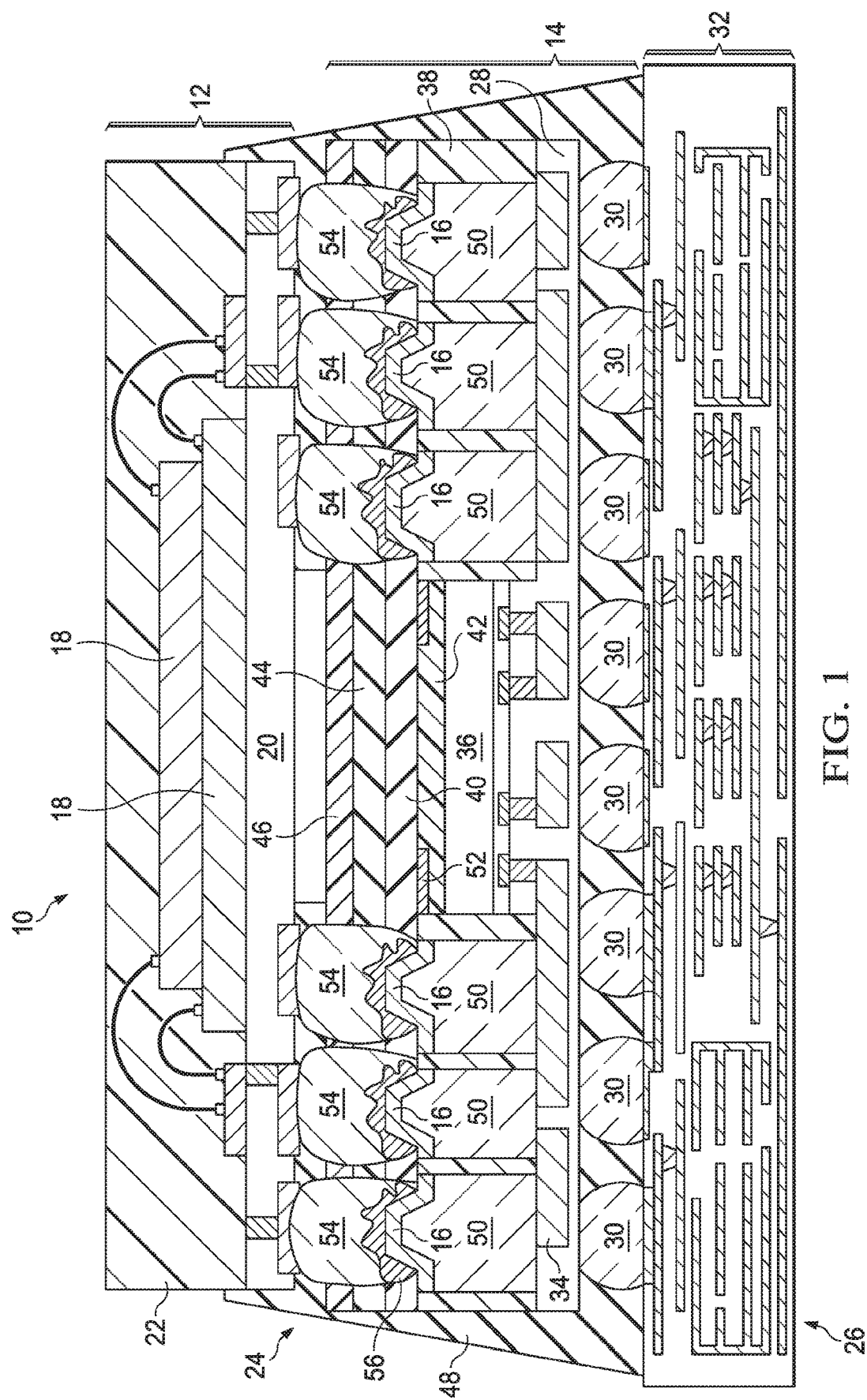
FIG. 1 illustrates an embodiment package on package (PoP) device utilizing protruding redistribution layer bond pads.

Referring now to FIG. 1, an embodiment PoP device 10 is illustrated. As shown, the PoP device 10 includes a top package 12 electrically coupled to a bottom package 14 using a protruding redistribution layer bond pad 16. As will be more fully explained below, the protruding or upwardly-projecting redistribution layer bond pad 16 provides numerous advantages and benefits for the PoP device 10 relative to other PoP devices. For example, the protruding redistribution layer bond pad 16 permits a backside redistribution layer (RDL) to be formed in an Integrated Fan Out Package on Package (InFO PoP) device, prevents cracks from occurring or propagating within the PoP device (e.g., between the molding compound and the metal via, at the backside RDL polymer, etc.), and so on.

As shown in FIG. 1, the top package 12 is mounted above the bottom package 14 in the embodiment PoP device 10. The top package 12 may include one or more dies 18. In an embodiment, the dies 18 are vertically discrete memory components. For example, each of the dies 18 may be a memory component such as, for example, a dynamic random access memory (DRAM) or another suitable type of memory. While two of the dies 18 are depicted in FIG. 1, more or fewer of the dies 18 may be included in other embodiments.

In an embodiment, the dies 18 in the top package 12 are electrically coupled to the bottom package 14 through wiring bonding as well as vias and contact pads in a top package substrate 20. The top package 12 may include molding compound 22 or another suitable encapsulant to cover the dies 18 and protect the wire bonding connections. In practical applications, each of the top and bottom packages 12, 14 may include various other components, layers, circuits, and structures that have been omitted herein for the sake of brevity.

The bottom package 14 has a front side 26 and a backside 24. At the front side 26, the bottom package 14 includes a bottom package substrate 28. In an embodiment, the bottom package substrate 28 is a polybenzoxaxole (PBO) or other suitable substrate material. As shown in FIG. 1, a number of solder features 30 are mounted to the bottom package substrate 28. In an embodiment, the solder features 30 are solder balls from a ball grid array (BGA). As shown, the solder features 30 permit the bottom package 14 to be mounted and electrically coupled to, for example, an underlying printed circuit board (PCB) 32 or other component.

The bottom package substrate 28 includes a front side redistribution layer 34. The frontside RDL 34 electrically couples a die 36 in the bottom package 14 to, for example, the solder features 30 and the PCB 32. In an embodiment, the die 36 in the bottom package 14 is a logic device or logic component (a logic integrated circuit, analog circuit, and so on). While one of the dies 36 is depicted in FIG. 1, it should be recognized that more of the dies 36 may be included in other embodiments. In an embodiment, the die 36 is encapsulated by molding compound 38 or another suitable encapsulant to cover the die 36.

In an embodiment, the die 36 is mounted beneath or to a passivation layer 40 using a die attach film (DAF) 42. In an embodiment, the passivation layer 40 comprises polybenzoxaxole (PBO), an Ajinomoto build-up film (ABF), or other suitable material. A buffer layer 44 may be disposed over the passivation layer 40. In an embodiment, the buffer layer 44 comprises PBO, an ABF, or other suitable material. Optionally, a laminating tape 46 may be disposed over the buffer layer 44. When used, the laminating tape 46 comprises a solder release (SR) film, an ABF, a backside laminating coating tape (LC tape) comprising a thermosetting polymer, or other suitable material.

In an embodiment, an underfill material 48 may be used to encapsulate portions of the top and bottom packages 12, 14 as shown in FIG. 1. The underfill material 48 may extend from a top surface of the PCB 32, along sides of the bottom package 14, and along a portion of the sides of the top package 12. In an embodiment, the underfill material 48 is only disposed between the top package substrate 20 and the laminating tape 46 or the buffer layer 44 if the laminating tape 46 was not used.

Still referring to FIG. 1, the bottom package 14 also includes through package vias (TPV) 50 extending between the front side 26 and the backside 24 of the bottom package 14. The through package vias 50, which may also be referred to herein as through InFO vias (TIVs) or metal vias, are embedded in and pass through the molding compound 38. In an embodiment, the through package vias 50 comprise copper, nickel (Ni), a copper alloy (copper/titanium), solder, a solder alloy including tin-silver (SnAg), tin-bismuth (SnBi), tin-copper (SnCu), tin-silver-copper (SnAgCu), tin-silver-copper-nickel (SnAgCuNi), or combinations thereof, or another metal. While six of the through package vias 50 are illustrated in FIG. 1, more or fewer of the through package vias 50 may be included in other embodiments.

The bottom package 14 also includes a backside redistribution layer 52. As shown, a portion of the backside redistribution layer (RDL) 52 extends over a top surface of the die 36. As such, the die 36 is electrically coupled to, for example, the dies 18 in the top package 12 and the through package vias 50. In addition, another portion of the backside redistribution layer 52 extends over the through package vias 50. In particular, the protruding redistribution layer bond pads 16 from the backside redistribution layer 52 are disposed on the upper portions of the through package vias 50. As will be more fully explained below, the protruding redistribution layer bond pads 16 cap or otherwise cover the top of the through package vias 50 in FIG. 1. In an embodiment, the protruding redistribution layer bond pads 16 and the through package vias 50 are formed from the same material (e.g., copper). As such, the protruding redistribution layer bond pads 16 and the through package vias 50 may appear to be a single unitary structure.

Solder features 54 are formed or mounted on, and electrically coupled to, the protruding redistribution layer bond pads 16. The solder features 54 electrically couple the top package 12 with the bottom package 14. In an embodiment, the solder features 54 are formed from solder paste, organic solderability preservative (OSP), or other suitable conductive material, or combinations thereof. In an embodiment, an intermetallic compound (IMC) 56 is disposed between the solder features 54 and the underlying redistribution layer bond pads 16 capping the through package vias 50. The intermetallic compound 56 is a product of a reflow process used to electrically couple the solder feature 54 and the through package vias 50.

Referring now to FIGS. 2A-2D, embodiments of the redistribution layer bond pads 16 capping the through package vias 50 are depicted in further detail. For the purposes of illustration, the solder feature 54 from the PoP device 10 (see FIG. 1) has been omitted.

Figure 2A:
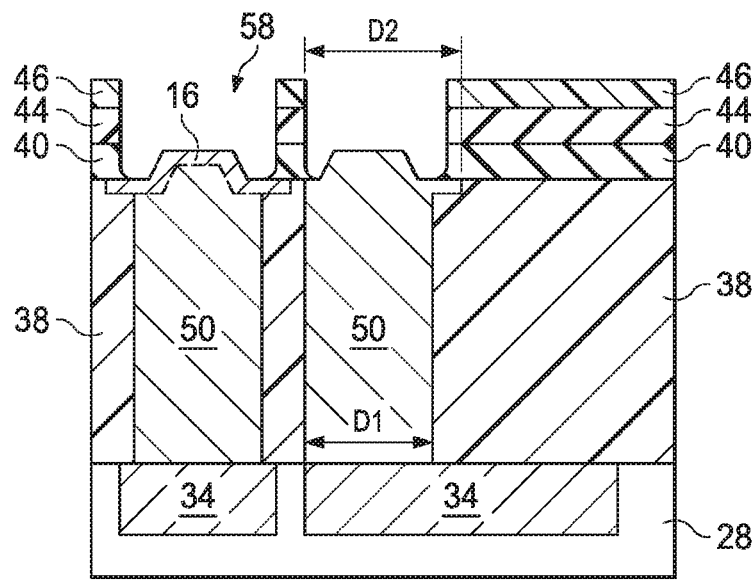
FIGS. 2A-2D illustrate embodiments of the redistribution layer bond pads in the PoP device of FIG. 1 capping metal vias.

In FIG. 2A, the through package vias 50 are embedded in the molding compound 38. The through package vias 50 extend from the redistribution layer bond pad 16 of the backside redistribution layer 52 to the front side redistribution layer 34 in the bottom package substrate 28. The passivation layer 40 is disposed over the molding compound 38 and the buffer layer 44 and the optional tape layer 46 are disposed over the passivation layer 40. As shown, a recess 58 extends through the passivation layer 40, the buffer layer 44, and the optional tape layer 46. The recess 58 is vertically aligned with the underlying through package via 50.

The redistribution layer bond pad 16 in FIG. 2A caps or otherwise covers the top surface of the through package via 50. Moreover, a portion of the redistribution layer bond pad 16 projects or extends above a top surface of the molding compound 38. In an embodiment, the central portion of the redistribution layer bond pad 16 protrudes or projects upwardly into the recess 58 while outer portions of the redistribution layer bond pad 16 are embedded in the molding compound 38. In other words, in an embodiment the redistribution layer bond pad 16 has a non-linear profile.

As shown, sidewalls of the portion of the redistribution layer bond pad 16 projecting above the top surface of the molding compound 38 are spaced apart from sidewalls of the laterally adjacent passivation layer 40. In an embodiment, a redistribution layer bond pad diameter D2 is greater than a metal via diameter D1. In addition, and as will be more fully explained below, no seed metal is disposed between the through package via 50 and the redistribution layer bond pad 16 in the embodiment of FIG. 2A.

Figure 2B:
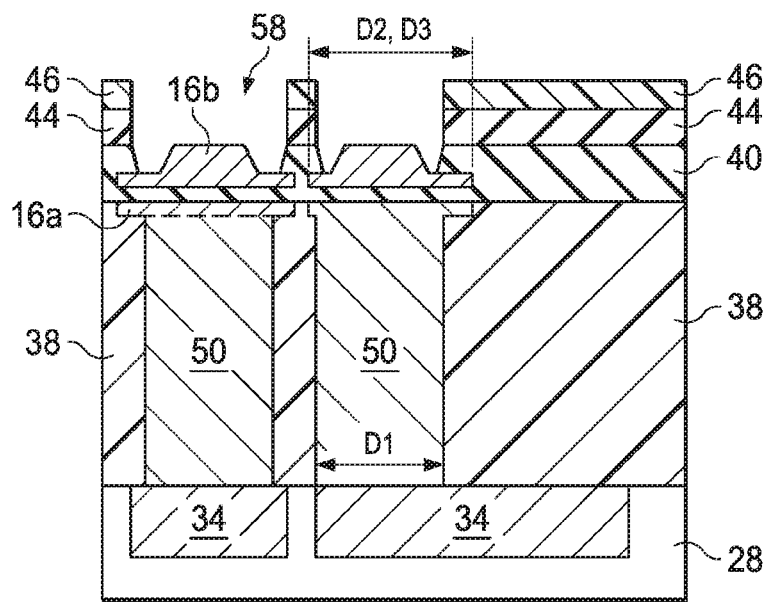

Referring now to FIG. 2B, a first redistribution layer bond pad 16a caps the metal via 50. In addition, a second redistribution layer bond pad 16b is vertically spaced apart from the first redistribution layer bond pad 16a by a portion of the passivation layer 40. As shown, a portion of the second redistribution layer bond pad 16b within the recess 58 projects upwardly away from the molding compound 38 and the underlying metal via 50. In an embodiment, a first redistribution layer bond pad diameter D2 and a second redistribution layer bond pad D3 are each greater than a metal via diameter D1.

Figure 2C:
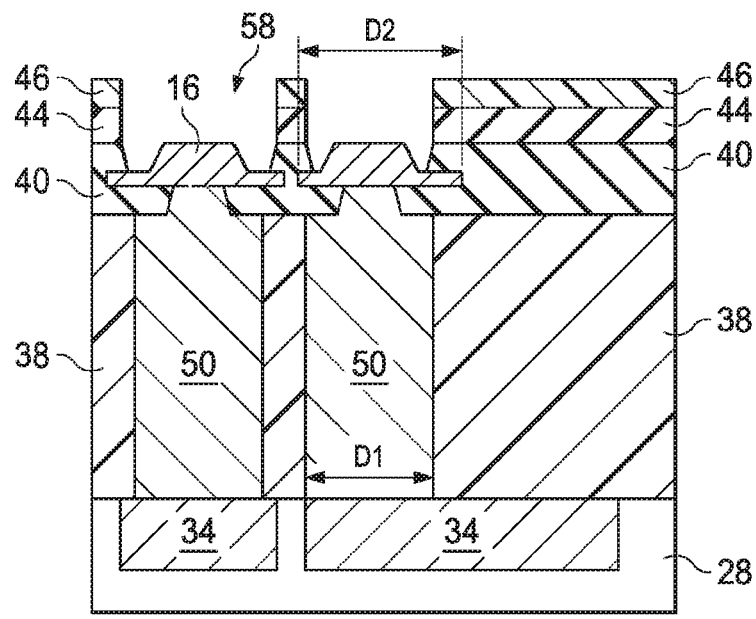

Referring now to FIG. 2C, the redistribution layer bond pad 16 caps the metal via 50. However, unlike the embodiment in FIG. 2A, a portion of the passivation layer 40 is disposed between the redistribution layer bond pad 16 and the metal via 50. In an embodiment, the redistribution layer bond pad diameter D2 is greater than the metal via diameter D1.

Figure 2D:
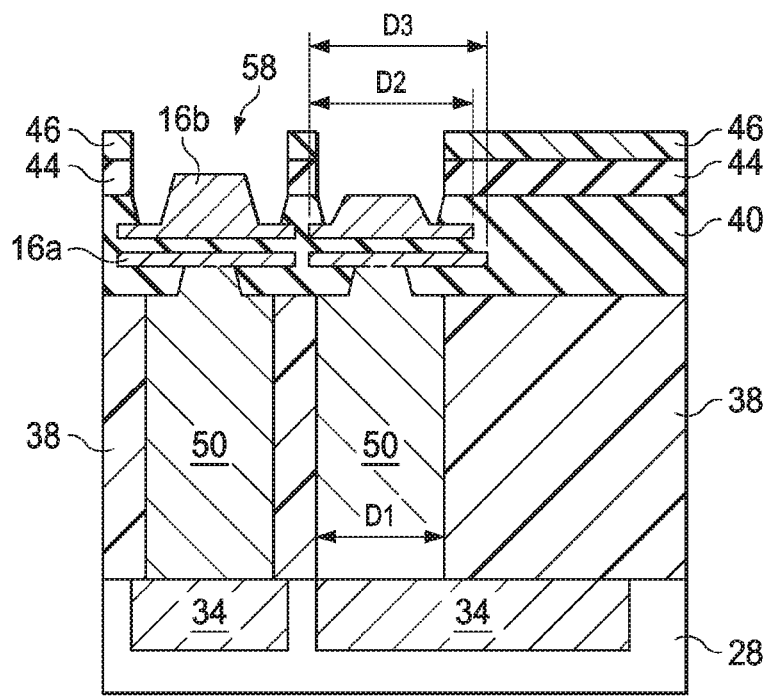

Referring now to FIG. 2D, the first redistribution layer bond pad 16a caps the metal via 50. However, a portion of the passivation layer 40 is disposed between the first redistribution layer bond pad 16a and the metal via 50. In addition, the second redistribution layer bond pad 16b is vertically spaced apart from the first redistribution layer bond pad 16a by another portion of the passivation layer 40. As shown, a portion of the second redistribution layer bond pad 16b within the recess 58 projects upwardly away from the top surface of the molding compound 38 and the metal via 50. In an embodiment, the first redistribution layer bond pad diameter D2 and the second redistribution layer bond pad D3 are each greater than the metal via diameter D1.

Figure 3:
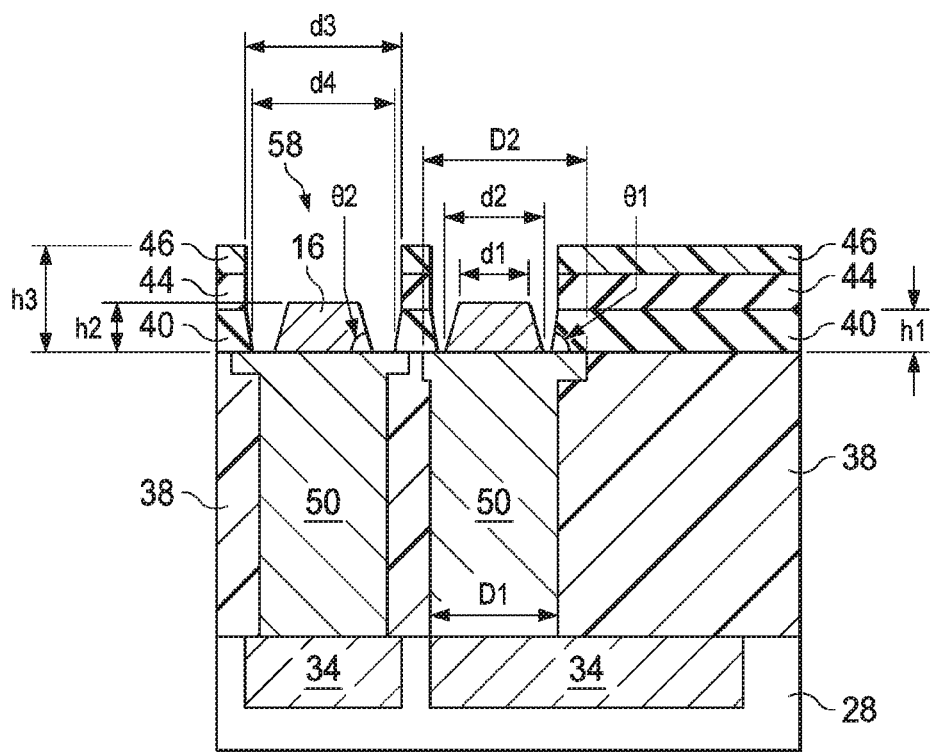
FIG. 3 illustrates dimension lines and angles pertaining to embodiment redistribution layer bond pads.

Referring now to FIG. 3, the embodiment redistribution layer bond pad 16 and metal via 50 depicted in FIG. 2A has been reproduced with dimension lines and angles, which may apply to the various embodiments described herein. In an embodiment, a diameter d1 of a top surface of the redistribution layer bond pad is less than or equal to a diameter d2 of a sidewall base of the redistribution layer bond pad.

In an embodiment, a profile angle $\theta_2$ of the redistribution layer bond pad, which is defined by sidewalls and a plane extending between a top surface of bond pad legs, is between about forty degrees and about ninety degrees. In an embodiment, a height h2 of the redistribution layer bond pad disposed above the molding compound 38 is greater than or equal to a height h1 of the passivation layer. In an embodiment, the height h2 is between about 1 μm and about 15 μm.

In an embodiment, the diameter d1 satisfies the formula: $d1=d2-2[h1(\tan \theta_2)]$, where d2 is the diameter of the sidewall base of the redistribution layer bond pad, h1 is the height of the passivation layer, and $\theta_2$ is the profile angle of the redistribution layer bond pad defined by sidewalls and a plane extending between a top surface of bond pad legs. In an embodiment, the diameter d1 is between about 65 μm and about 290 μm.

In an embodiment, the diameter D2 of the redistribution layer bond pad is greater than or equal to the diameter d2 of a sidewall base of the redistribution layer bond pad. In an embodiment, diameter D2 is between about 30 μm and about 380 μm. In an embodiment, diameter d2 is between about 80 μm and about 300 μm.

In an embodiment, the diameter D1 of the metal via 50 is less than or equal to the diameter d2 of a sidewall base of the redistribution layer bond pad. In an embodiment, diameter D1 is between about 80 μm and about 300 μm. In an embodiment, diameter d2 is between about 80 μm and about 300 μm. In an embodiment, the protruding redistribution layer bond pad 16 has a roughness (Ra) of between about 0.2 μm to about 1 μm.

In an embodiment, a diameter d3 at the top of the recess 58 (which exist in the tape layer 46, the buffer layer 44, or the passivation layer 40 depending on the layers used for fabrication of the PoP device 10) is greater than a diameter d4 at the bottom of the recess 58. In other words, the recess 58 gets progressively wider from bottom to top and a top opening of the recess 58 is greater than a bottom opening of the recess 58.

In an embodiment, a height h3 of the tape layer 46, the buffer layer 44, and/or the passivation layer 40 (depending on the layers used for fabrication of the PoP device 10) is greater than the height h2 of the redistribution layer bond pad 16 disposed above the molding compound 38. If, however, a portion of the passivation layer 40 is disposed beneath the redistribution layer bond pad 16 (see, for example, FIG. 2B), then the height h2 is measured from a top surface of the laterally extending legs of the redistribution layer bond pad 16. In an embodiment, the height h3 is between about 1 μm and about 55 μm. In an embodiment, an open profile angle $\theta_1$ of the recess 58, which is defined by sidewalls of the recess 58 and a top surface of legs of the redistribution layer bond pad 16, is between about forty degrees and about seventy degrees.

Figure 4A:
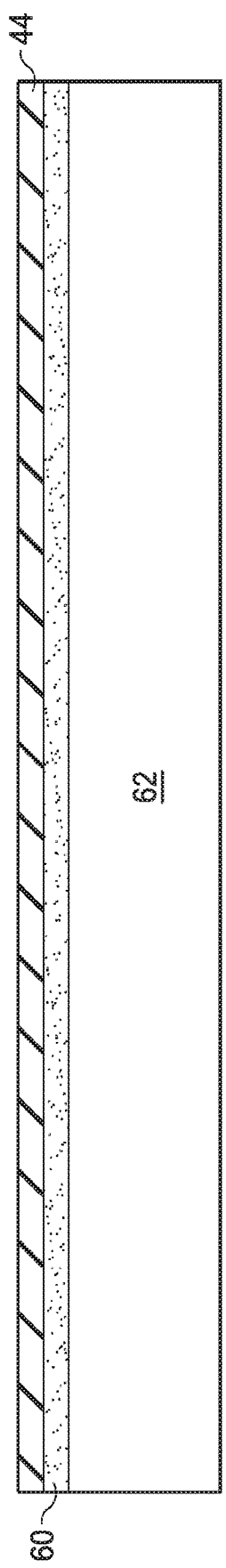
FIGS. 4A-4T collectively schematically illustrates a process flow used to manufacture the embodiment PoP device 10 utilizing the protruding redistribution bond pads of FIG. 1.
Figure 4B:
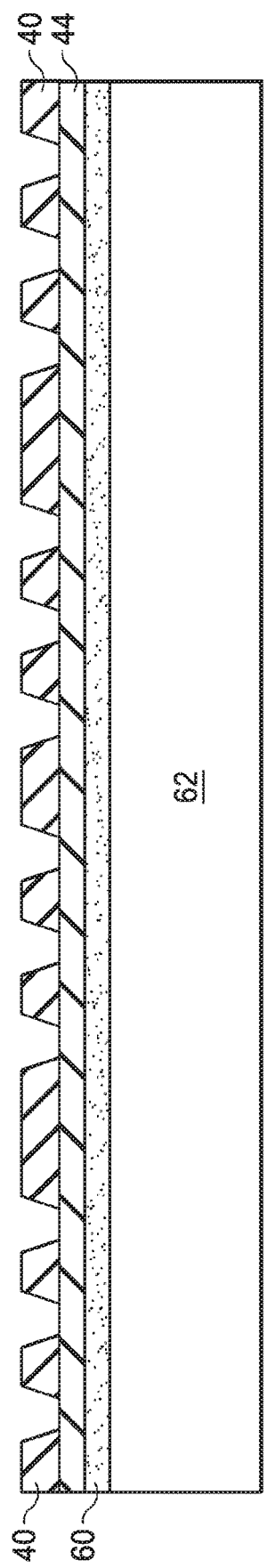
Figure 4C:
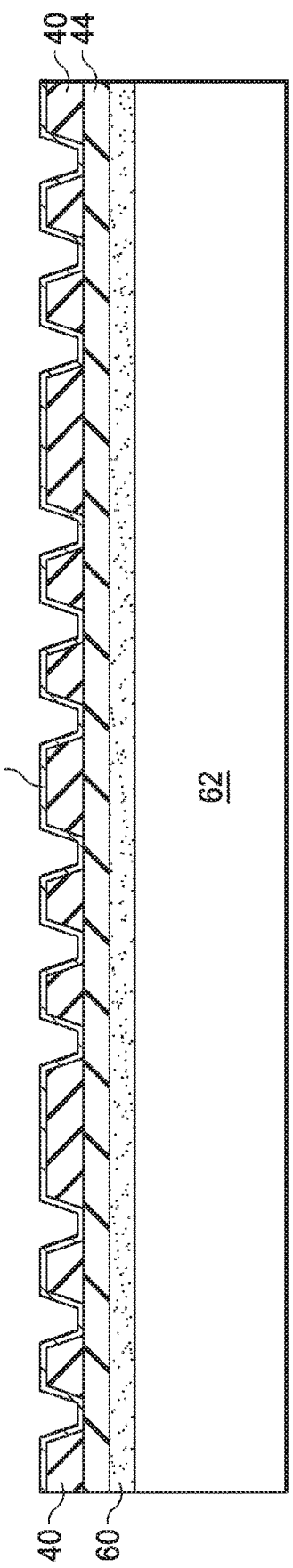
Figure 4F:
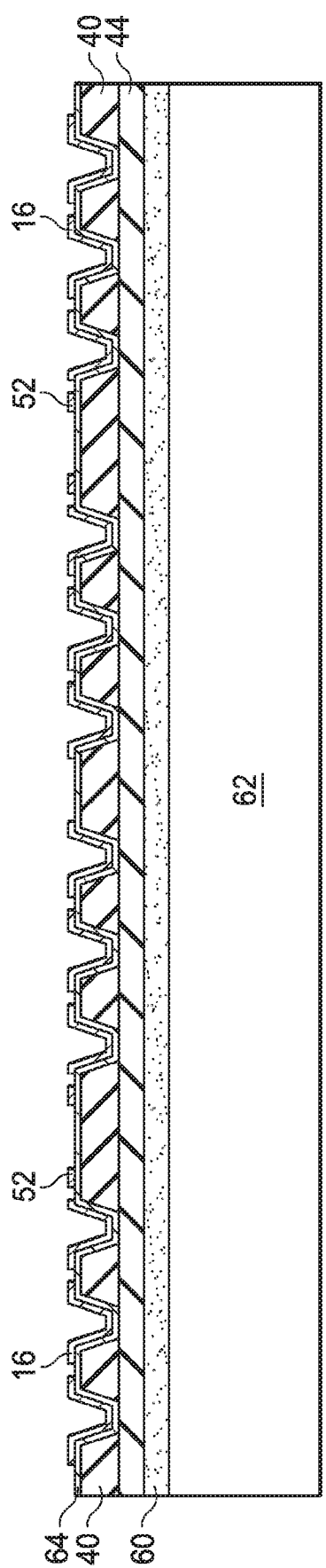
Figure 4G:
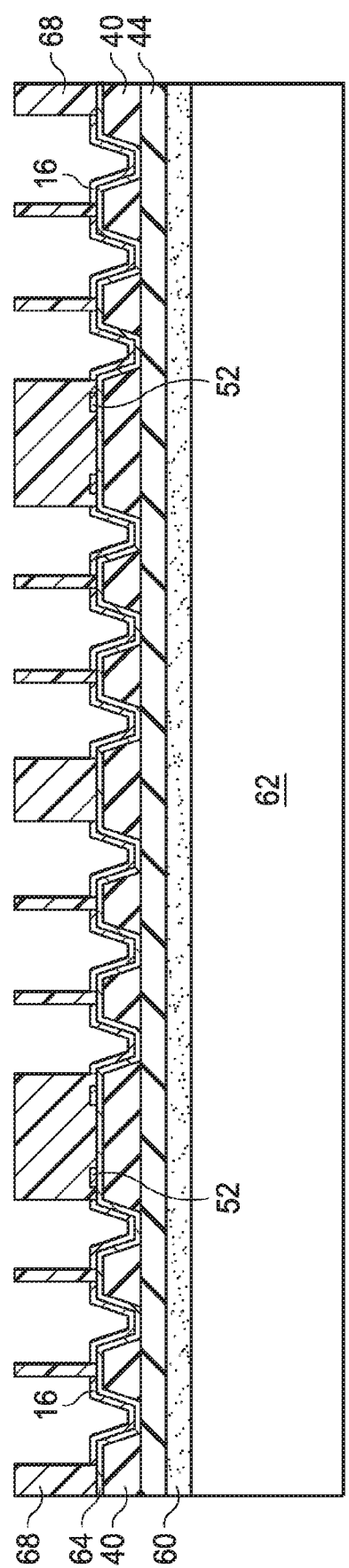
Figure 4H:
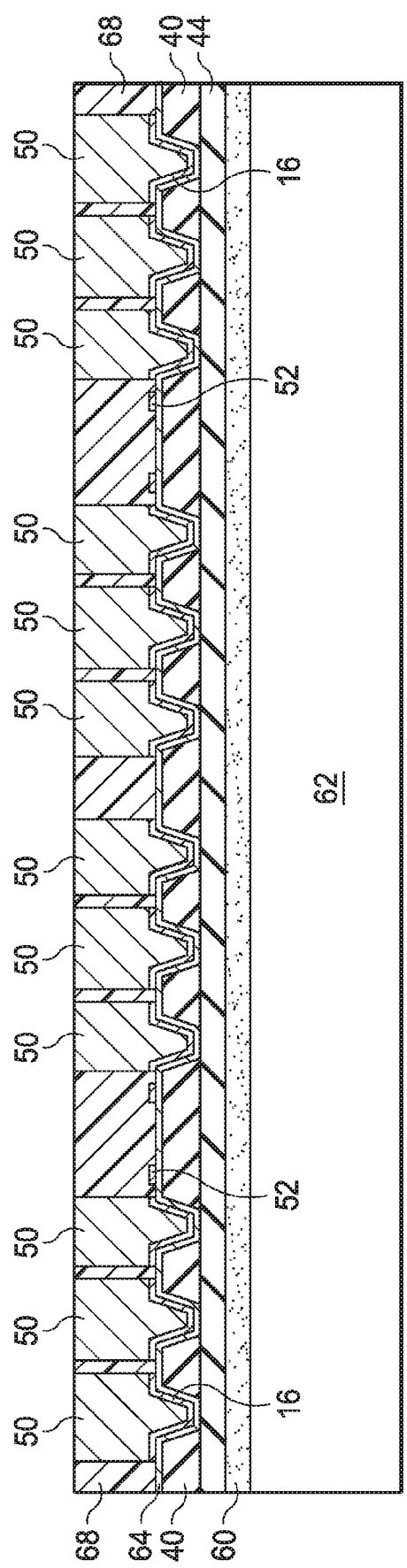
Figure 4I:
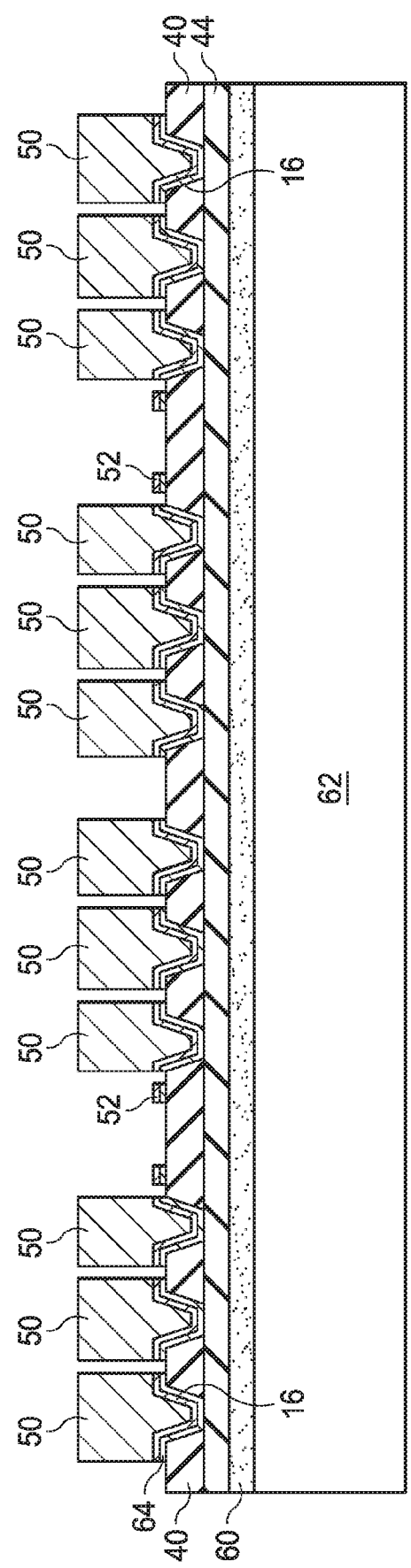
Figure 4J:
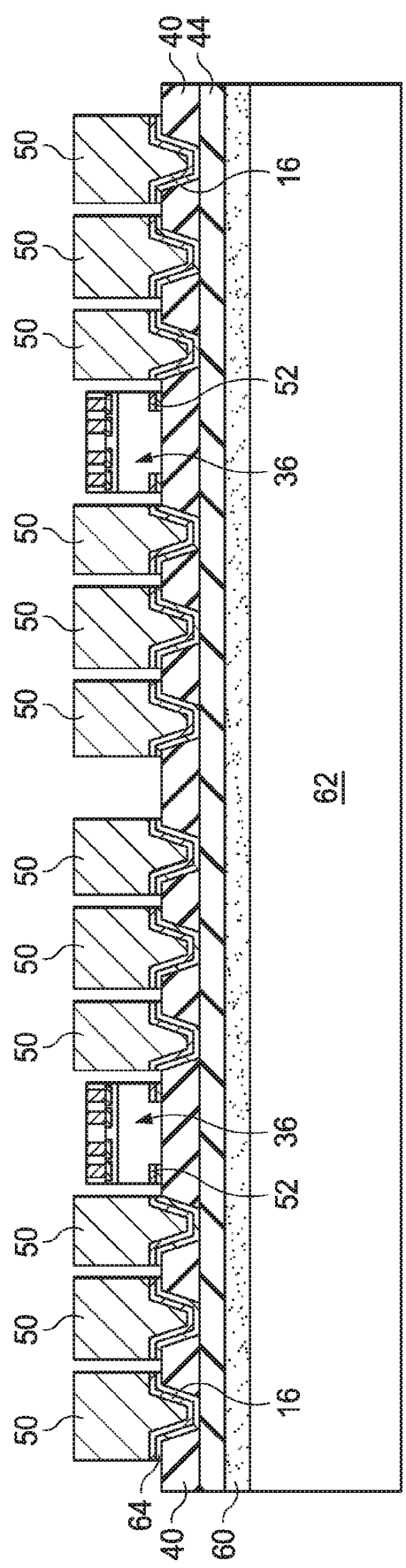
Figure 4K:
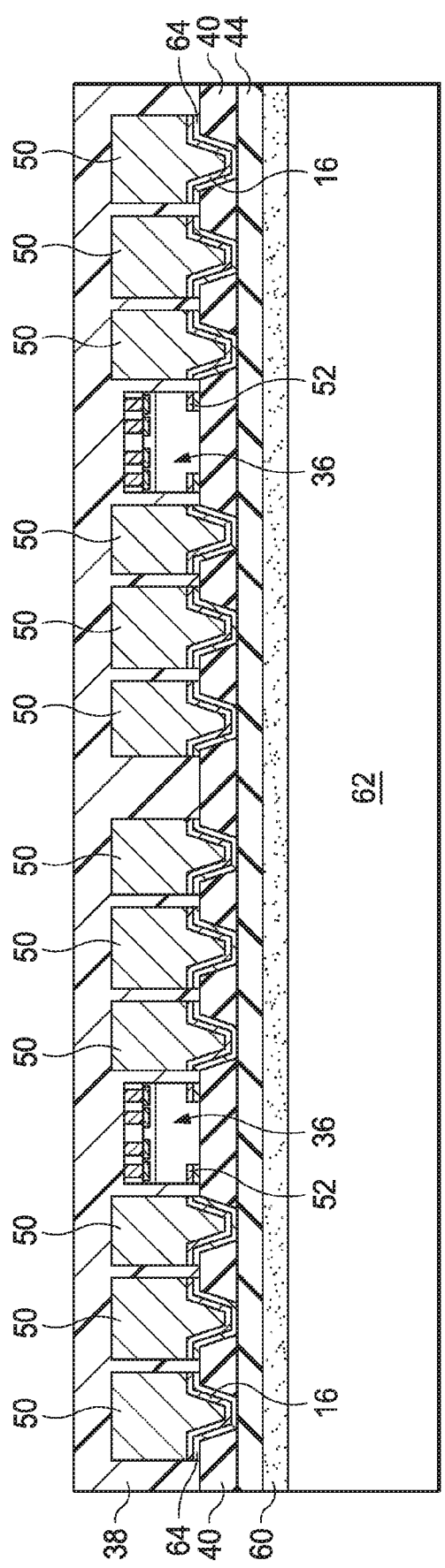
Figure 4L:
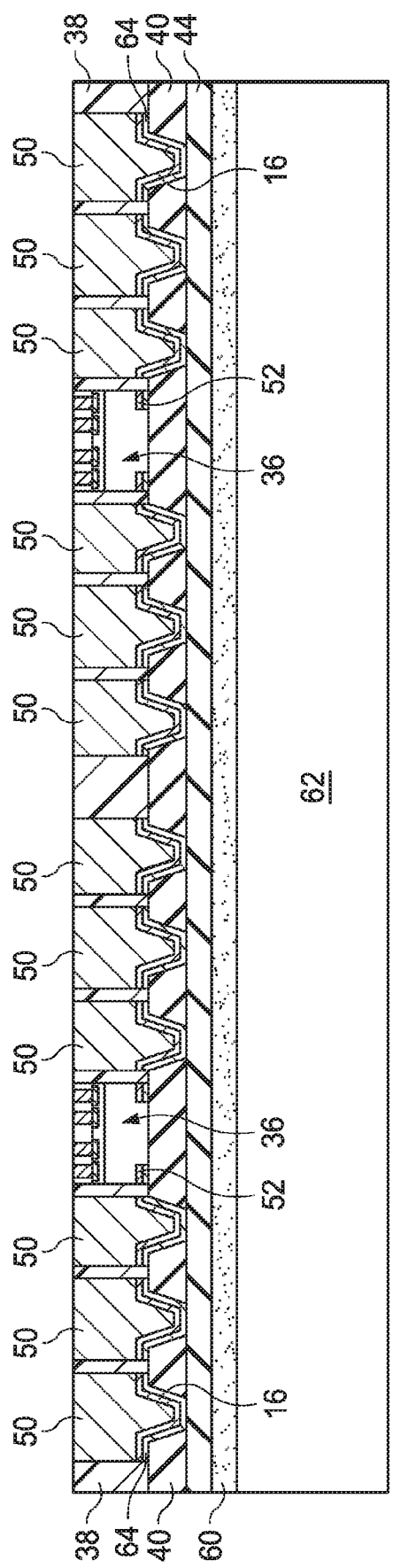
Figure 4M:
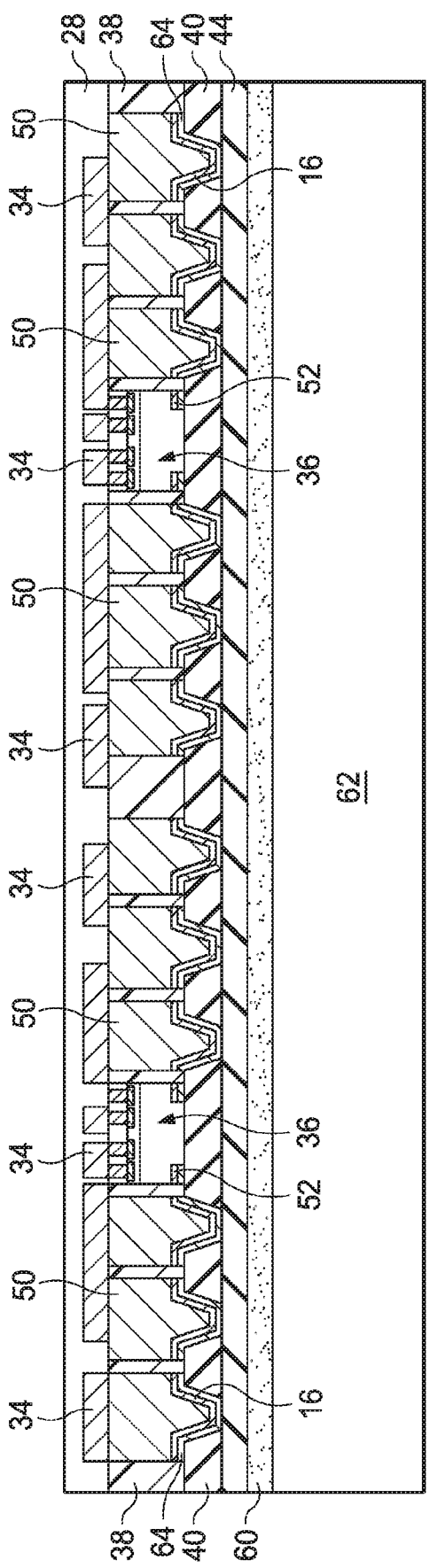
Figure 4N:
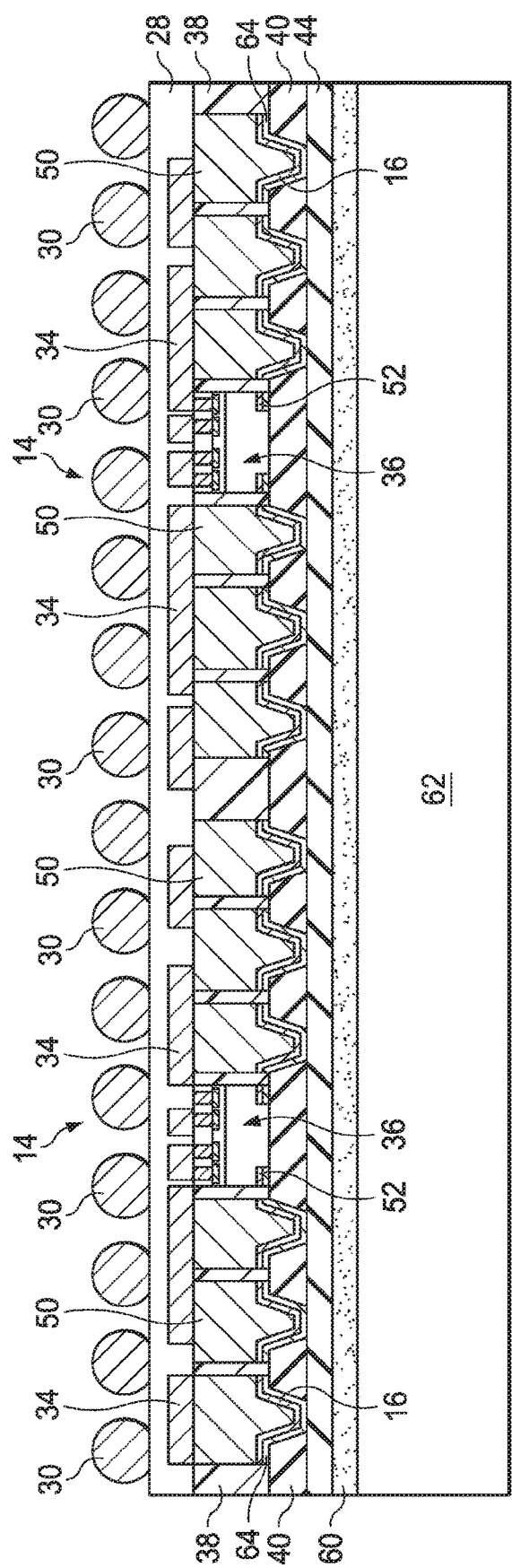
Figure 4O:
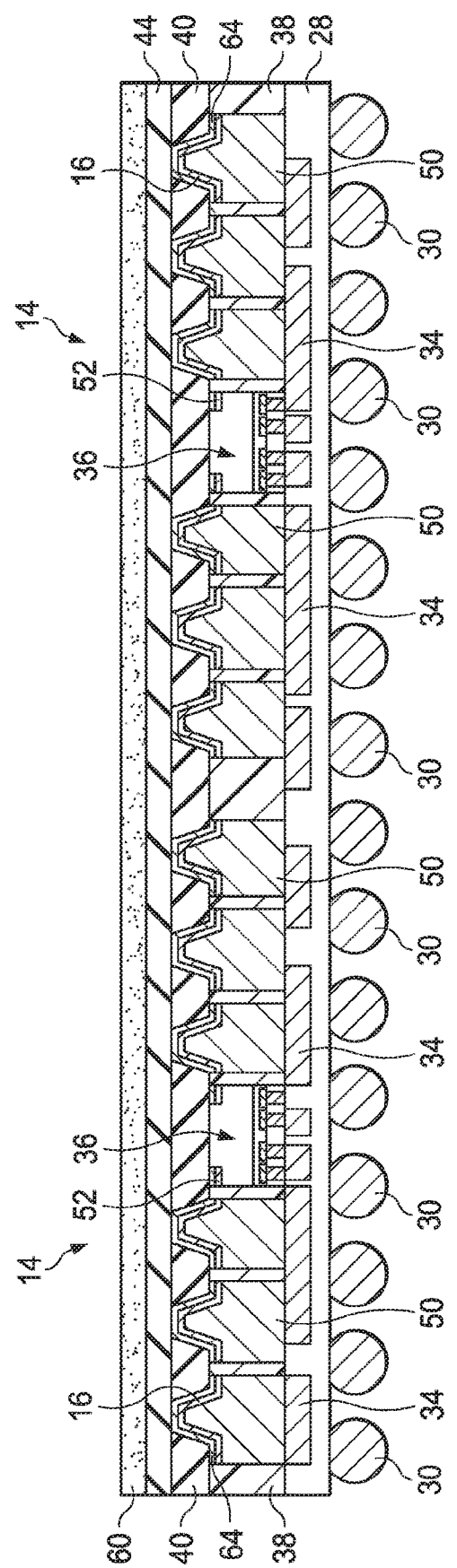
Figure 4R:
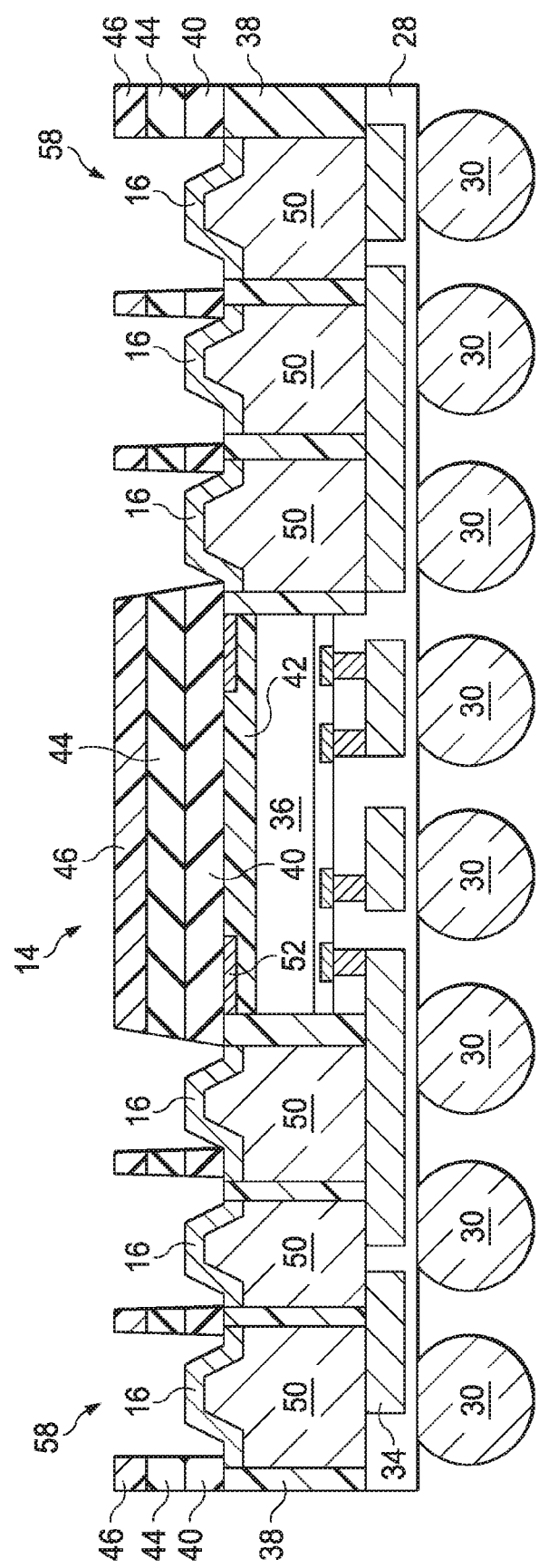
Figure 4S:
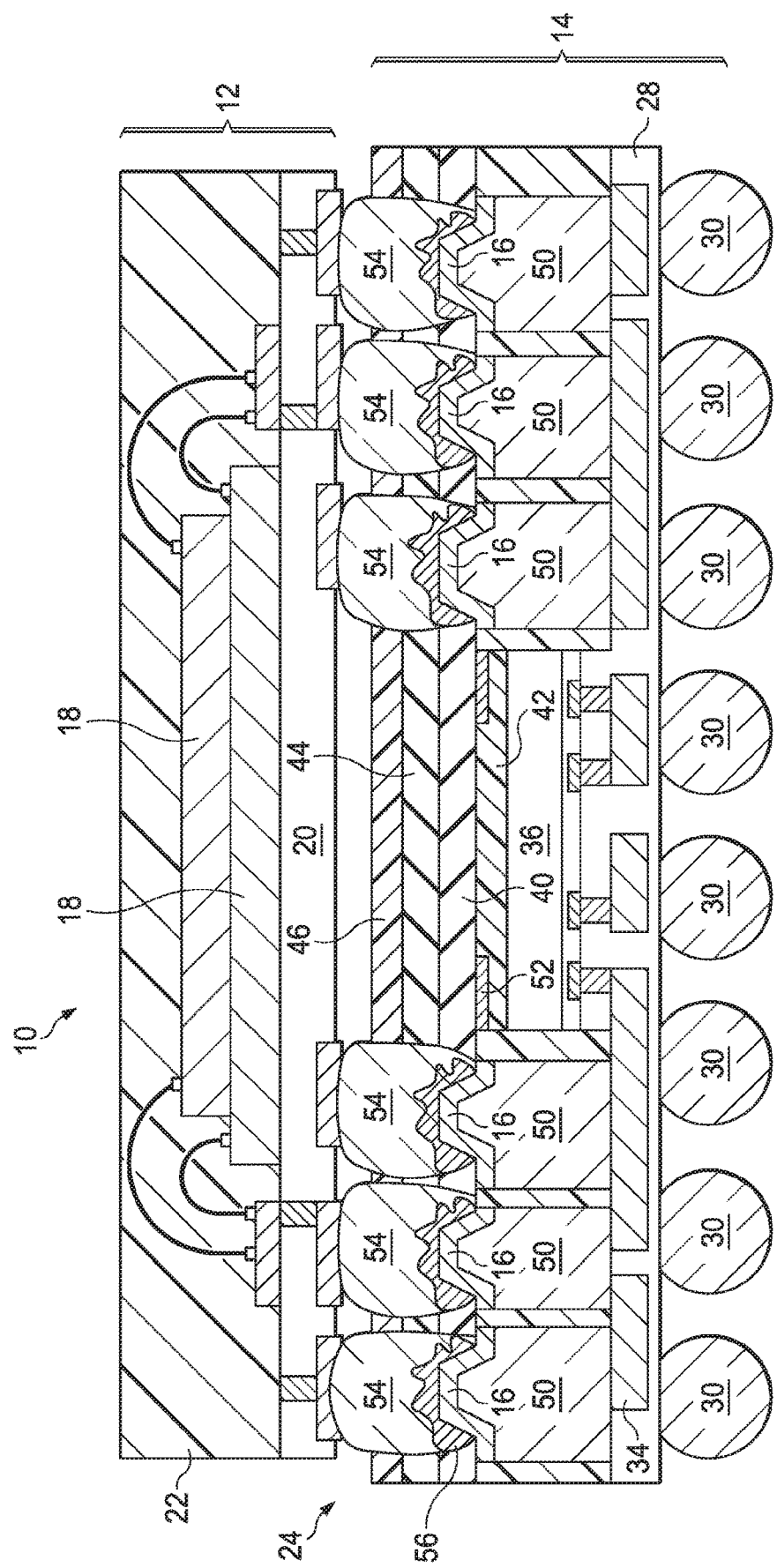
Figure 4T:
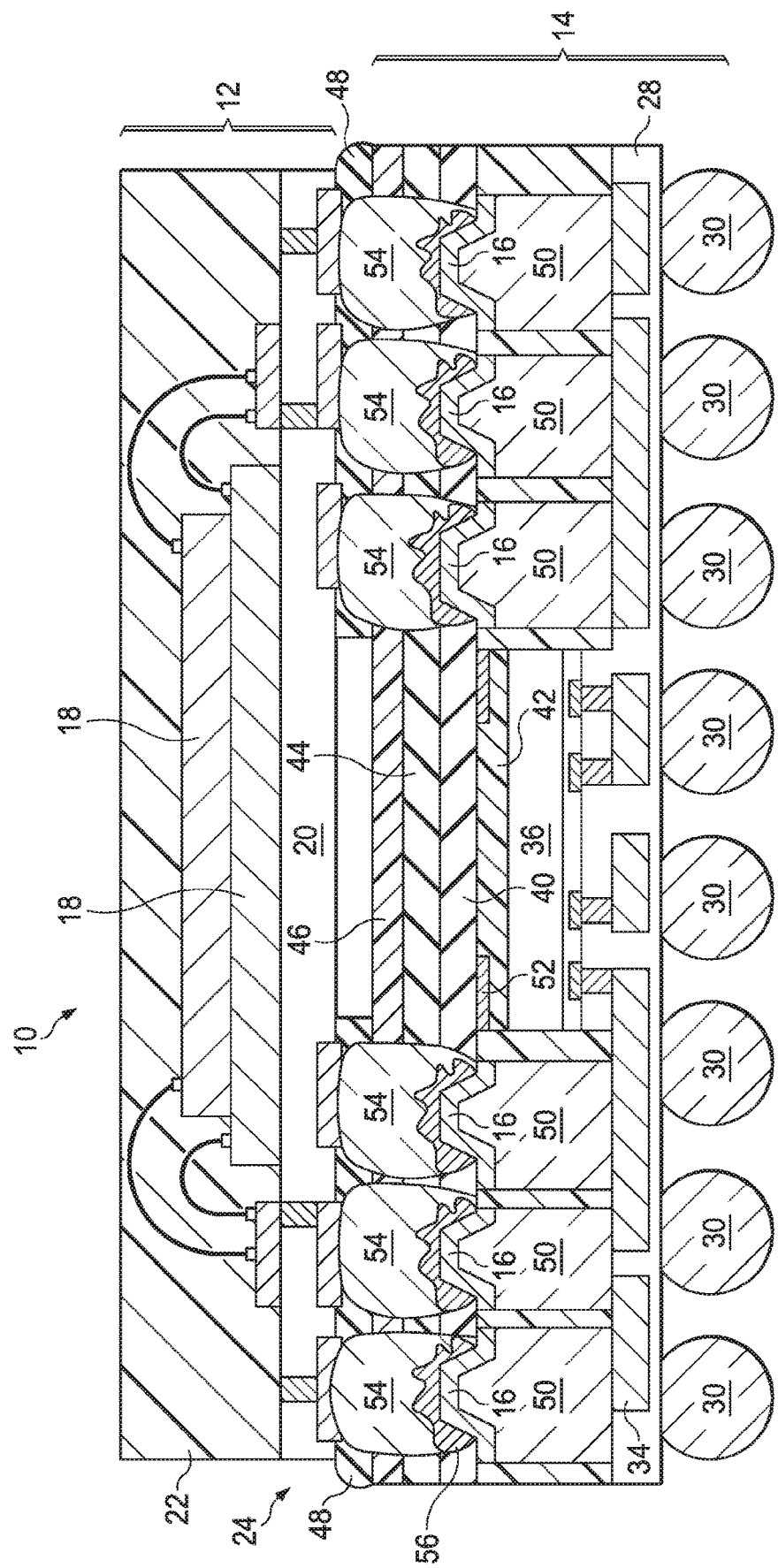

FIGS. 4A-4T collectively schematically illustrate a process flow used to manufacture the embodiment PoP device 10 utilizing the protruding redistribution bond pads 16 as shown in FIGS. 1 and 2A. In FIG. 4A, a glue layer 60 and the buffer layer 44 are deposited over a carrier 62. In FIG. 4B, the passivation layer 40 is deposited over the buffer layer 44 and then patterned. In FIG. 4C, a seed metal 64 is deposited over the patterned passivation layer 40. In an embodiment, the seed metal 64 is copper, a copper alloy (e.g., copper/titanium), or another metal.

In FIG. 4D, a photo resist (PR) 66 is deposited over the seed metal 64 and patterned so that the backside redistribution layer may be formed. In FIG. 4E, the backside redistribution layer 52, including the redistribution layer bond pads 16, is formed. As shown in FIG. 4E, the redistribution layer bond pads 16 have a non-linear or non-linear profile. In an embodiment, the method may be modified to form the redistribution layer bond pads 16 shown in FIGS. 2B-2D by, for example, using additional metal layers or material, depositing additional passivation layers or material, and so on.

In FIG. 4F, the photo resist 66 is stripped away or otherwise removed to expose the redistribution layer 52, which includes the redistribution layer bond pads 16. In FIG. 4G, a dry film release (DFR) layer 68 is deposited and patterned so that the through package vias (a.k.a., the through InFO vias) may be formed. In an embodiment, the dry film release layer 68 is deposited through a lamination process.

In FIG. 4H, the through package vias 50 are formed in the openings defined by the dry film release layer 68. Thereafter, as shown in FIG. 4I, the dry film release layer 68 is stripped away or otherwise removed. In addition, a removal process is performed to remove portions of the seed layer 64 disposed beyond the redistribution layer 52. In FIG. 4J, the die 36 (a.k.a., chip) is placed. In an embodiment, the die 36 is mounted to the exposed passivation layer 40 using the die attach film 42.

Next, as shown in FIG. 4K, the molding compound 38 is deposited over the die 36 and the through package vias 50 (a.k.a., through InFO vias, metal vias). As shown in FIG. 4L, a mold grinding process is performed to remove a top portion of the molding compound 38 and expose the metal vias 50 and contacts on the exterior surface of the die 36. In FIG. 4M, the front side redistribution layer 34 and the under bump metallization (UBM) is formed and then covered by the bottom package substrate 28.

In FIG. 4N, solder features 30 (e.g., solder balls from a BGA) are mounted and electrically coupled to the under bump metallization. In an embodiment, testing is performed at this stage to ensure the bottom package 14 has been suitably formed. Thereafter, the bottom package 14 is debonded from the carrier 62 and flipped over as shown in FIG. 4O.

In FIG. 4P, the glue layer 60 is removed and, optionally, the tape layer 46 is deposited. In FIG. 4Q, a laser drilling process is performed to produce the recess 58 and expose the redistribution layer bond pads 16 from the redistribution layer 52. In an embodiment, the recess 58 passes through the tape layer 46, the buffer layer 44, and the passivation layer 40. In FIG. 4R, individual bottom packages 14 are singulated from one another.

In FIG. 4S, the top package 12 is mounted onto the bottom package 14. In other words, a die bonding process is performed to reflow the solder features 54. In an embodiment, the top and bottom packages 12, 14 are electrically coupled together by reflowing the solder features 54. In FIG. 4T, the underfill 48 (or a sealing material, encapsulant, etc.), may optionally be inserted between or formed around the top and bottom packages 12, 14. Thereafter, as shown in FIG. 1, the PoP device 10 may be mounted to the printed circuit board 32.

From the foregoing it should be recognized that the protruding redistribution layer bond pads 16 provide beneficial features and advantages. For example, the protruding redistribution layer bond pads 16 permit a backside redistribution layer (RDL) to be formed in an Integrated Fan Out Package on Package (InFO PoP) device, prevent cracks from occurring or propagating within the PoP device (e.g., between the molding compound and the metal via, at the backside RDL polymer, etc.), and so on.

An embodiment package on package (PoP) device includes a molding compound having a metal via embedded therein, a passivation layer disposed over the molding compound, the passivation layer including a passivation layer recess vertically aligned with the metal via, and a redistribution layer bond pad capping the metal via, a portion of the redistribution layer bond pad within the passivation layer recess projecting above a top surface of the molding compound.

An embodiment package on package (PoP) device includes a molding compound having a metal via embedded therein, a passivation layer disposed over the molding compound, the passivation layer including a passivation layer recess vertically aligned with the metal via, a first redistribution layer bond pad capping the metal via, and a second redistribution layer bond pad vertically spaced apart from the first redistribution layer bond pad by a portion of the passivation layer, a portion of the second redistribution layer bond pad within the passivation layer recess projecting above a top surface of the molding compound.

An embodiment method of forming a through package via (TPV) for a package includes embedding a metal via in a molding compound, forming a passivation layer over the molding compound, forming a passivation layer recess in the passivation layer, the passivation layer recess vertically aligned with the metal via, and capping the metal via with a redistribution layer bond pad such that a portion of the redistribution layer bond pad within the passivation layer recess projects above a top surface of the molding compound.

An embodiment package on package (PoP) device includes a first die at least laterally encapsulated in a molding compound, the first die having an active surface and a backside surface, the active surface being opposite the backside surface, the molding compound having a first side and a second side, the second side being opposite the first side, a metal via extending through the molding compound from the first side to the second side of the molding compound, and a passivation layer disposed over the first side of the molding compound and the backside surface of the first die, the passivation layer including a passivation layer recess vertically aligned with the metal via. The PoP device further includes a redistribution layer bond pad capping the metal via, a portion of the redistribution layer bond pad within the passivation layer recess projecting above the first side of the molding compound, and a solder joint contacting a top surface and sidewalls of the redistribution layer bond pad, the solder joint being within the passivation layer recess.

An embodiment package on package (PoP) device includes a first package. The first package includes a molding compound having a first die and a metal via embedded therein, the molding compound having a first side and a second side, the second side being opposite the first side, the metal via extending from the first side to the second side of the molding compound, and a passivation layer adjoining a first side of the molding compound, the passivation layer including a passivation layer recess vertically aligned with the metal via. The first package further includes a first redistribution layer bond pad capping the metal via, the first redistribution layer bond pad having a first portion projecting from the first side of the molding compound into the passivation layer recess, and a second redistribution layer adjoining the second side of the molding compound, the second redistribution layer being electrically coupled to the first die and the metal via. The PoP device further includes a second package comprising a second die, and a first set of solder joints coupling the first package to the second package, at least one of the first set of solder joints contacting a top surface and sidewalls of the redistribution layer bond pad, the at least one of the first set of solder joints contacting sidewalls of the passivation layer within the passivation layer recess.

An embodiment package on package (PoP) device includes a die having an active surface and a backside surface, the active surface being opposite the backside surface, a molding compound extending along sidewalls of the die, the molding compound having a first surface and a second surface, the second surface being opposite the first surface, and a metal via embedded in the molding compound adjacent the die, a first portion of the metal via extending from the first surface of the molding compound to the second surface of the molding compound. The PoP device further includes a passivation layer over the molding compound and the die, the first surface of the molding compound and the backside surface of the die facing the passivation layer, a second portion of the metal via extending above the first surface of the molding compound and into the passivation layer, a width of the second portion of the metal via decreasing as the second portion of the metal via extends into the passivation layer, a redistribution layer bond pad extending along a top surface and a sidewall of the second portion of the metal via, and a solder joint contacting a top surface and sidewalls of the redistribution layer bond pad, the solder joint being within the passivation layer recess.

An embodiment method includes forming a passivation layer over a carrier substrate, the passivation layer having a first surface and a second surface, the first surface of the passivation layer being opposite the second surface of the passivation layer, the second surface of the passivation layer facing the carrier substrate. The passivation layer is patterned to form a first opening therein, a width of the first opening decreasing as the first opening extends from the first surface of the passivation layer toward the second surface of the passivation layer. A first conductive material is deposited along a bottom and sidewalls of the first opening to form a first conductive layer. A second conductive material is deposited over the first conductive layer in the first opening to form a second conductive layer. A conductive pillar is formed over the second conductive layer. Portions of the first conductive layer not protected by the conductive pillar and the second conductive layer are removed. An integrated circuit die is attached to the passivation layer adjacent the conductive pillar. The integrated circuit die and the conductive pillar are encapsulated with a molding compound. The carrier substrate is removed. The passivation layer is recessed to expose a first portion of the first conductive layer disposed on the sidewalls of the first opening.

An embodiment method includes forming a passivation layer over a carrier substrate, the passivation layer having a first surface and a second surface, the first surface of the passivation layer being opposite the second surface of the passivation layer, the second surface of the passivation layer facing the carrier substrate. The passivation layer is patterned to form a first opening therein, a first width of the first opening at the first surface of the passivation layer being greater than a second width of the first opening at the second surface of the passivation layer. A first conductive layer is conformally formed over the passivation layer and in the first opening. A first sacrificial layer is formed over the first conductive layer. The first sacrificial layer is patterned to form a second opening therein, the second opening exposing a first portion of the first conductive layer disposed on a bottom and sidewalls of the first opening. A second conductive layer is formed over the first portion of the first conductive layer exposed by the second opening. The first sacrificial layer is removed. A second sacrificial layer is formed over the first conductive layer and the second conductive layer. The second sacrificial layer is patterned to form a third opening therein, the third opening exposing the second conductive layer. A conductive pillar is formed over the second conductive layer exposed by the third opening. The second sacrificial layer is removed. Exposed portions of the first conductive layer are removed. An integrated circuit die is attached to the passivation layer adjacent the conductive pillar. The integrated circuit die and the conductive pillar are encapsulated with a molding compound. The carrier substrate is removed. The passivation layer is recessed to expose the first portion of the first conductive layer.

An embodiment method includes forming a buffer layer over a carrier substrate. A passivation layer is formed over the buffer layer, the passivation layer having a first surface and a second surface, the first surface of the passivation layer being opposite the second surface of the passivation layer, the second surface of the passivation layer facing the buffer layer. The passivation layer is patterned to form a first opening therein, a width of the first opening decreasing as the first opening extends from the first surface of the passivation layer toward the second surface of the passivation layer. A first conductive material is conformally deposited over the first surface of the passivation layer and in the first opening to form a first conductive layer. A first sacrificial layer is formed over the first conductive layer. The first sacrificial layer is patterned to form a second opening and a third opening therein, the second opening exposing a first portion of the first conductive layer disposed on a bottom and sidewalls of the first opening, the third opening exposing a second portion of the first conductive layer disposed on the first surface of the passivation layer. A second conductive material is deposited in the second opening to form a second conductive layer over the first portion of the first conductive layer. The second conductive material is deposited in the third opening to form a third conductive layer over the second portion of the first conductive layer. The first sacrificial layer is removed. A second sacrificial layer is formed over the first conductive layer, the second conductive layer, and the third conductive layer. The second sacrificial layer is patterned to form a fourth opening therein, the fourth opening exposing the second conductive layer. A third conductive material is deposited in the fourth opening to form a conductive pillar over the second conductive layer. The second sacrificial layer is removed. Portions of the first conductive layer not covered by the conductive pillar, the second conductive layer and the third conductive layer are removed. An integrated circuit die is attached to the passivation layer, the third conductive layer being interposed between the integrated circuit die and the passivation layer. The integrated circuit die and the conductive pillar are encapsulated with a molding compound. The carrier substrate is removed. The buffer layer and the passivation layer are patterned to form a fifth opening, the fifth opening exposing the first portion of the first conductive layer.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method comprising:
    forming a passivation layer over a carrier substrate, the passivation layer having a first surface and a second surface, the first surface of the passivation layer being opposite the second surface of the passivation layer, the second surface of the passivation layer facing the carrier substrate;
    patterning the passivation layer to form a first opening therein, a width of the first opening decreasing as the first opening extends from the first surface of the passivation layer toward the second surface of the passivation layer;
    depositing a first conductive material along a bottom and sidewalls of the first opening to form a first conductive layer;
    depositing a second conductive material over the first conductive layer in the first opening to form a second conductive layer;
    forming a conductive pillar over the second conductive layer;
    removing portions of the first conductive layer not protected by the conductive pillar and the second conductive layer;
    attaching an integrated circuit die to the passivation layer adjacent the conductive pillar;
    encapsulating the integrated circuit die and the conductive pillar with a molding compound;
    removing the carrier substrate; and
    recessing the passivation layer to expose a first portion of the first conductive layer disposed on the sidewalls of the first opening, the recessing forming a gap between a sidewall of the passivation layer and the first portion of the first conductive layer.

2. The method of claim 1, further comprising:
    forming a redistribution layer over the conductive pillar, the integrated circuit die, and the molding compound, the redistribution layer being electrically connected to the conductive pillar and the integrated circuit die; and
    forming a plurality of connectors over the redistribution layer, the plurality of connectors being in electrical contact with the redistribution layer.

3. The method of claim 1, further comprising planarizing the molding compound to expose the conductive pillar.

4. The method of claim 1, wherein recessing the passivation layer comprises performing a laser drilling process on the passivation layer.

5. The method of claim 1, further comprising forming a solder joint in physical contact with the first portion of the first conductive layer.

6. The method of claim 1, wherein attaching the integrated circuit die to the passivation layer comprises attaching the integrated circuit die to the passivation layer using a die attach film.

7. The method of claim 1, wherein a width of the conductive pillar is greater than a maximal width of the first opening.

8. A method comprising:
    forming a passivation layer over a carrier substrate, the passivation layer having a first surface and a second surface, the first surface of the passivation layer being opposite the second surface of the passivation layer, the second surface of the passivation layer facing the carrier substrate;
    patterning the passivation layer to form a first opening therein, a first width of the first opening at the first surface of the passivation layer being greater than a second width of the first opening at the second surface of the passivation layer;

conformally forming a first conductive layer over the passivation layer and in the first opening;

forming a first sacrificial layer over the first conductive layer;

patterning the first sacrificial layer to form a second opening therein, the second opening exposing a first portion of the first conductive layer disposed on a bottom and sidewalls of the first opening;

forming a second conductive layer over the first portion of the first conductive layer exposed by the second opening;

removing the first sacrificial layer;

forming a second sacrificial layer over the first conductive layer and the second conductive layer;

patterning the second sacrificial layer to form a third opening therein, the third opening exposing the second conductive layer;

forming a conductive pillar over the second conductive layer exposed by the third opening;

removing the second sacrificial layer;

removing exposed portions of the first conductive layer;

attaching an integrated circuit die to the passivation layer adjacent the conductive pillar;

encapsulating the integrated circuit die and the conductive pillar with a molding compound;

removing the carrier substrate;

after removing the carrier substrate, forming a laminating tape adjacent the passivation layer, the second surface of the passivation layer facing the laminating tape; and recessing the passivation layer and the laminating tape to expose the first portion of the first conductive layer.

9. The method of claim 8, further comprising:

before removing the carrier substrate, forming a redistribution layer over the conductive pillar, the integrated circuit die, and the molding compound, the redistribution layer being electrically connected the second conductive layer through the conductive pillar; and before removing the carrier substrate, forming a plurality of connectors over the redistribution layer, the plurality of connectors being electrically connected to the conductive pillar through the redistribution layer.

10. The method of claim 8, wherein the molding compound extends along a sidewall the first conductive layer and a sidewall of the second conductive layer.

11. The method of claim 8, wherein forming the conductive pillar comprises filling the third opening with a conductive material.

12. The method of claim 8, wherein a width of the second opening is greater than the first width of the first opening.

13. The method of claim 8, wherein the first sacrificial layer and the second sacrificial layer comprise different materials.

14. The method of claim 8, wherein a width of the conductive pillar is greater than the first width of the first opening.

15. A method comprising:

forming a buffer layer over a carrier substrate;

forming a passivation layer over the buffer layer, the passivation layer having a first surface and a second surface, the first surface of the passivation layer being opposite the second surface of the passivation layer, the second surface of the passivation layer facing the buffer layer;

patterning the passivation layer to form a first opening therein, a width of the first opening decreasing as the first opening extends from the first surface of the passivation layer toward the second surface of the passivation layer, the first opening exposing a first surface of the buffer layer;

conformally depositing a first conductive material over the first surface of the passivation layer and in the first opening to form a first conductive layer;

forming a first sacrificial layer over the first conductive layer;

patterning the first sacrificial layer to form a second opening and a third opening therein, the second opening exposing a first portion of the first conductive layer disposed on a bottom and sidewalls of the first opening, the third opening exposing a second portion of the first conductive layer disposed on the first surface of the passivation layer;

depositing a second conductive material in the second opening to form a second conductive layer over the first portion of the first conductive layer;

depositing the second conductive material in the third opening to form a third conductive layer over the second portion of the first conductive layer;

removing the first sacrificial layer;

forming a second sacrificial layer over the first conductive layer, the second conductive layer, and the third conductive layer;

patterning the second sacrificial layer to form a fourth opening therein, the fourth opening exposing the second conductive layer;

depositing a third conductive material in the fourth opening to form a conductive pillar over the second conductive layer;

removing the second sacrificial layer;

removing portions of the first conductive layer not covered by the conductive pillar, the second conductive layer and the third conductive layer;

attaching an integrated circuit die to the passivation layer, the third conductive layer being interposed between the integrated circuit die and the passivation layer;

encapsulating the integrated circuit die and the conductive pillar with a molding compound;

removing the carrier substrate; and patterning the buffer layer and the passivation layer to form a fifth opening in the buffer layer and the passivation layer, a width of the fifth opening decreasing as the fifth opening extends from the second surface of the buffer layer toward the first surface of the passivation layer, the second surface of the buffer layer being opposite the first surface of the buffer layer, the fifth opening exposing the first portion of the first conductive layer.

16. The method of claim 15, wherein patterning the buffer layer and the passivation layer comprises performing a laser drilling process on the buffer layer and the passivation layer.

17. The method of claim 15, wherein the first conductive material is different from the second conductive material.

18. The method of claim 15, wherein the first conductive material is different from the third conductive material.

19. The method of claim 15, further comprising forming a solder joint in physical contact with the first portion of the first conductive layer and sidewalls of the fifth opening.

20. The method of claim 15, wherein at least a portion of the conductive pillar extends below the first surface of the passivation layer.

* * * * *